United States Patent
Chakrabarti et al.

[19]

[11] Patent Number: 5,911,830
[45] Date of Patent: Jun. 15, 1999

[54] METHOD AND FIXTURE FOR LASER BAR FACET COATING

[75] Inventors: Utpal Kumar Chakrabarti, Allentown; Paul Sangone Chen, Mohnton; George John Przybylek, Douglasville; Dominic Paul Rinaudo, Blandon, all of Pa.

[73] Assignee: Lucent Technologies Inc., Murray Hill, N.J.

[21] Appl. No.: 08/844,455

[22] Filed: Apr. 18, 1997

Related U.S. Application Data

[60] Provisional application No. 60/019,068, May 9, 1996.

[51] Int. Cl.$^6$ .................................................. C23C 14/00
[52] U.S. Cl. ............................................ 118/503; 118/728
[58] Field of Search ..................................... 118/503, 728

[56] References Cited

U.S. PATENT DOCUMENTS

| | | | |
|---|---|---|---|
| 4,391,696 | 7/1983 | Cowden | 204/297 |
| 4,397,724 | 8/1983 | Moran | 204/192 |
| 5,063,173 | 11/1991 | Gasser et al. | 437/129 |
| 5,154,333 | 10/1992 | Bauer et al. | 225/1 |
| 5,171,717 | 12/1992 | Broom et al. | 437/226 |

FOREIGN PATENT DOCUMENTS

| | | | |
|---|---|---|---|
| 0 615 824 A1 | 2/1994 | European Pat. Off. | B28D 7/04 |
| 3418332 A1 | 11/1985 | Germany . | |
| 63-028859 | 2/1988 | Japan | C23C 14/24 |
| 63-308922 | 12/1988 | Japan | H01S 3/18 |
| 03268382 | 11/1991 | Japan | H01S 3/18 |

*Primary Examiner*—Richard Bueker
*Attorney, Agent, or Firm*—David L. Smith

[57] ABSTRACT

A method and fixture for laser bar facet coating are disclosed. A holder for securing devices having surfaces for coating includes first and second channels. A plurality of web slats are received in the channels. The web slats have first and second ends and first and second device engaging surfaces. The ends of the web slats are received in respective channels. The ends of the web slats cooperate with the ends of adjacent web slats. The web slats are secured at one end of the channels and otherwise are movable along the channels between an open position to receive devices therebetween for coating and a closed position in which edges of the web slats engage the devices received therebetween for coating. A bias member may be used to retain the web slats in the closed position gripping the devices for coating. In another embodiment, the invention provides a method for coating surfaces of substantially parallelepiped devices. The method includes securing at least one parallelepiped device between a pair of device engaging surfaces in a holder, mounting the holder in a vacuum chamber, and establishing a surface coating environment in the vacuum chamber.

18 Claims, 6 Drawing Sheets

METHOD AND FIXTURE FOR LASER BAR FACET COATING

This application claims benefit of Provisional Appln 60/019,068 filed May 9, 1996.

TECHNICAL FIELD

This invention relates to semiconductor laser diodes, and in particular to a method and fixture for laser bar facet coating.

BACKGROUND OF THE INVENTION

In the process of fabricating semiconductor laser diodes, semiconductor laser chips are coated on opposing facets to provide mirrored surfaces, or partially mirrored surfaces, that reflect substantially all or a portion of the light created within the chip when the diode is powered and operating. The coating process is carried out in a high-vacuum deposition chamber. Strips of semiconductor laser chips, called bars, are held in a fixture for deposition of optical coating material or materials on facets of the bars. Existing fixtures do not hold the bars in a relatively small or compact area with the result that the deposition of coating materials is not uniform on all of the bars processed simultaneously. Furthermore, the throughput capacity has been limited in that each fixture could only support a few bars.

What is needed is a method and fixture for laser bar facet coating that compactly holds laser bars for deposition of optical coating material, and results in a more uniform coating of the material on the bar facets. A fixture that also provides increased capacity would result in a more economical process due to an increased number of bars being coated using the same amount of optical coating material in each batch of the process.

SUMMARY OF THE INVENTION

In accordance with an illustrative embodiment of the invention, a method and fixture for laser bar facet coating are disclosed. A holder for securing devices having surfaces for coating includes first and second channels. A plurality of web slats are received in the channels. The web slats have first and second ends and first and second device engaging surfaces. The ends of the web slats are received in respective channels. The ends of the web slats cooperate with the ends of adjacent web slats. The web slats are secured at one end of the channels and otherwise are movable along the channels between an open position to receive devices therebetween for coating and a closed position in which edges of the web slats engage the devices received therebetween for coating. A bias member may be used to retain the web slats in the closed position gripping the devices for coating. In another embodiment, the invention provides a method for coating surfaces of substantially parallelepiped devices. The method includes securing at least one parallelepiped device between a pair of device engaging surfaces in a holder, mounting the holder in a vacuum chamber, and establishing a surface coating environment in the vacuum chamber.

DETAILED DESCRIPTION

Figure 1:
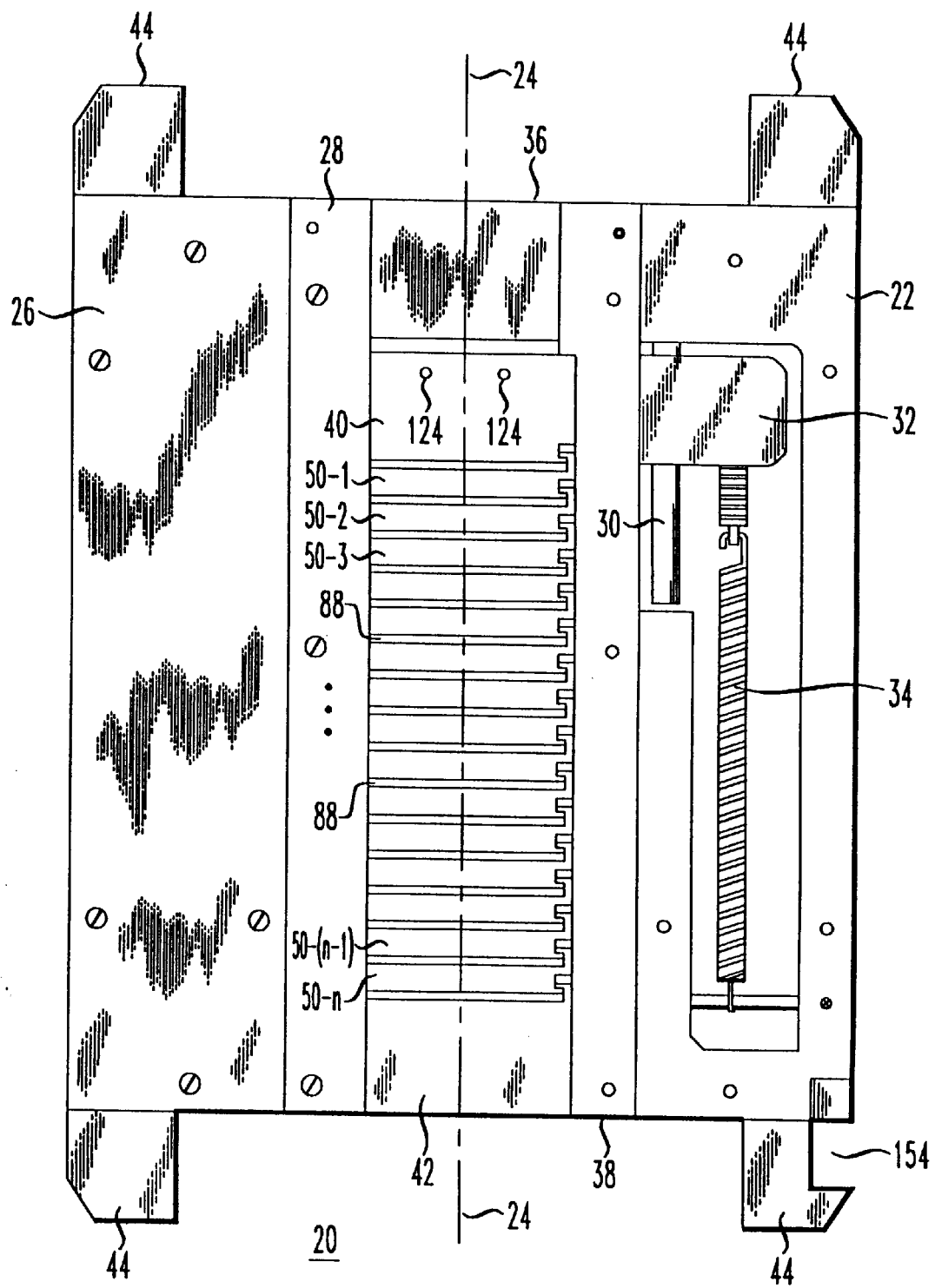
FIG. 1 is a top view of a fixture for holding semiconductor laser bars for bar facet coating, in accordance with the present invention, having the web slats in an open or separated position.

FIG. 1 is a top view of a fixture 20 for holding semiconductor laser bars for facet coating. Fixture 20 includes a frame 22 which supports other members. Fixture 20 is substantially symmetric about center line 24, however, the invention is not limited thereto. Cover plates that are mirror images of cover plates 26 and 28 (here also referred to by reference numerals 26 and 28, respectively) are removed from the right side of fixture 20 to reveal a guide rail 30, a portion of cross member 32, and a spring 34. Beneath the shown cover plates 26 and 28 on the left side of center line 24 in FIG. 1, are another guide rail 30, spring 34 and the other end of cross member 32. Also revealed by the removed cover plate 28 are ends of first plate 40, second plate 42, and a plurality of web slats 50.

Figure 2:
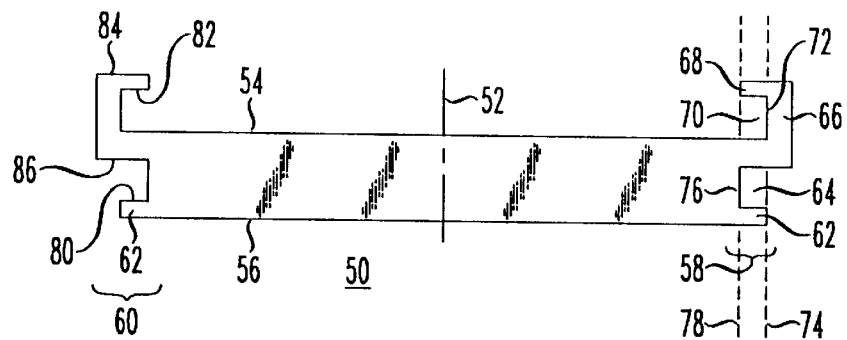
FIG. 2 is an enlarged top view of a web slat used in the fixture of FIG. 1.

The structure of each of web slats 50 is substantially identical and is best seen in FIG. 2 which shows an enlarged top view of a single web slat 50. Each web slat has first and second laser bar engaging surfaces 54 and 56, and first and second ends 58 and 60. In a preferred embodiment, web slats 50 are symmetrical about center line 52, although the invention is not limited thereto. Only one end will be described here with the understanding that, due to symmetry, both ends are described. Each end has a protrusion 62 proximate second laser bar engaging surface 56. Adjacent protrusion 62 is a recess 64. An extension 66 extends from the end proximate first laser bar engaging surface 54. Extension 66 has a distal end 68 extending toward center line 52, defining a recess 70 adjacent first laser bar engaging surface 54.

The first and second ends 58 and 60 of each web slat 50 are interlocked with the ends of adjacent web slats or with first plate 40 or second plate 42. Because each end of a web slat 50 cooperates with one of the plates 40 or 42, or with the end of another web slat 50 adjacent both laser engaging surfaces 54 and 56 (as shown in FIGS. 1, 3, 4 and 5), the dimensions of the various features on the ends of web slats 50 are dimensioned relative to other features on the ends. Such relative sizing also permits all of web slats 50 to be identical.

In the illustrative embodiment, protrusion 62, which may have an edge coextensive with second laser bar engaging surface 56, does not extend outward beyond the inner edge 72 of recess 70, as indicated by line 74. Similarly, distal end 68 does not extend towards center line 52 beyond the inner edge 76 of recess 64, as indicated by line 78. The width of protrusion 62 from surface 80 to second laser bar engaging surface 56 is smaller than the width of recess 70 between surface 82 and first laser bar engaging surface 54. The width of recess 70 is slightly greater than the width of protrusion 62 plus the thickness of a laser bar 90 from surface 96 to surface 98. Similarly, the width of distal end 68 between surface 82 and surface 84 is smaller than the width of recess 64 between surfaces 80 and 86. The width of recess 64 is slightly greater than the width of protrusion 68 plus the thickness of a laser bar 90 from surface 96 to surface 98. Web slats 50 in accordance with the present invention can be made by a process such as electro-discharge machining.

Figure 3:
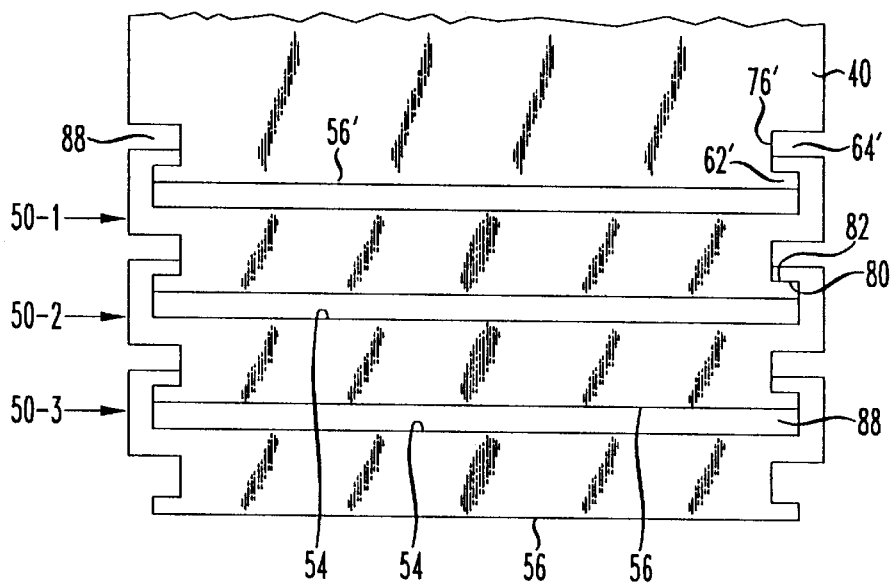
FIG. 3 is an enlarged top view of a few adjacent web slats used in the fixture of FIG. 1, in the open position.
Figure 5:
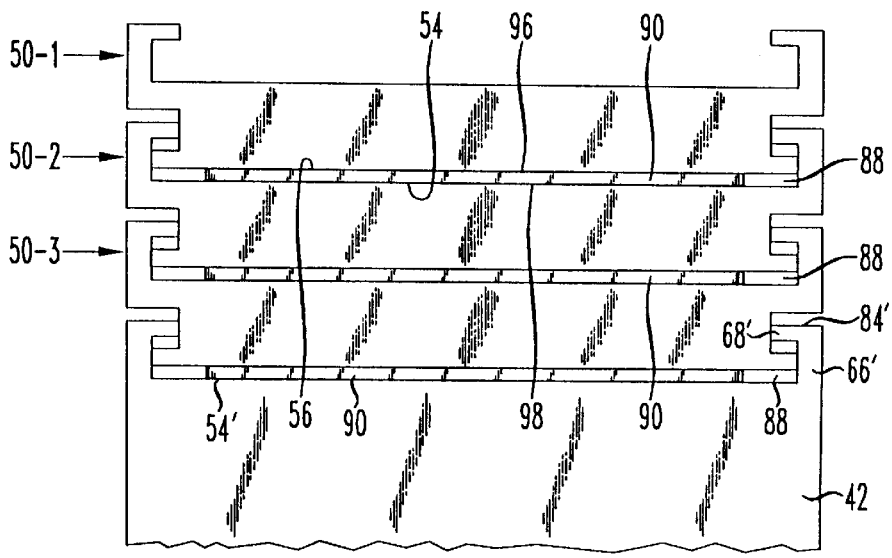
FIG. 5 is an enlarged top view of the web slats of FIG. 3 in the closed position with laser bars secured therebetween.
Figure 4:
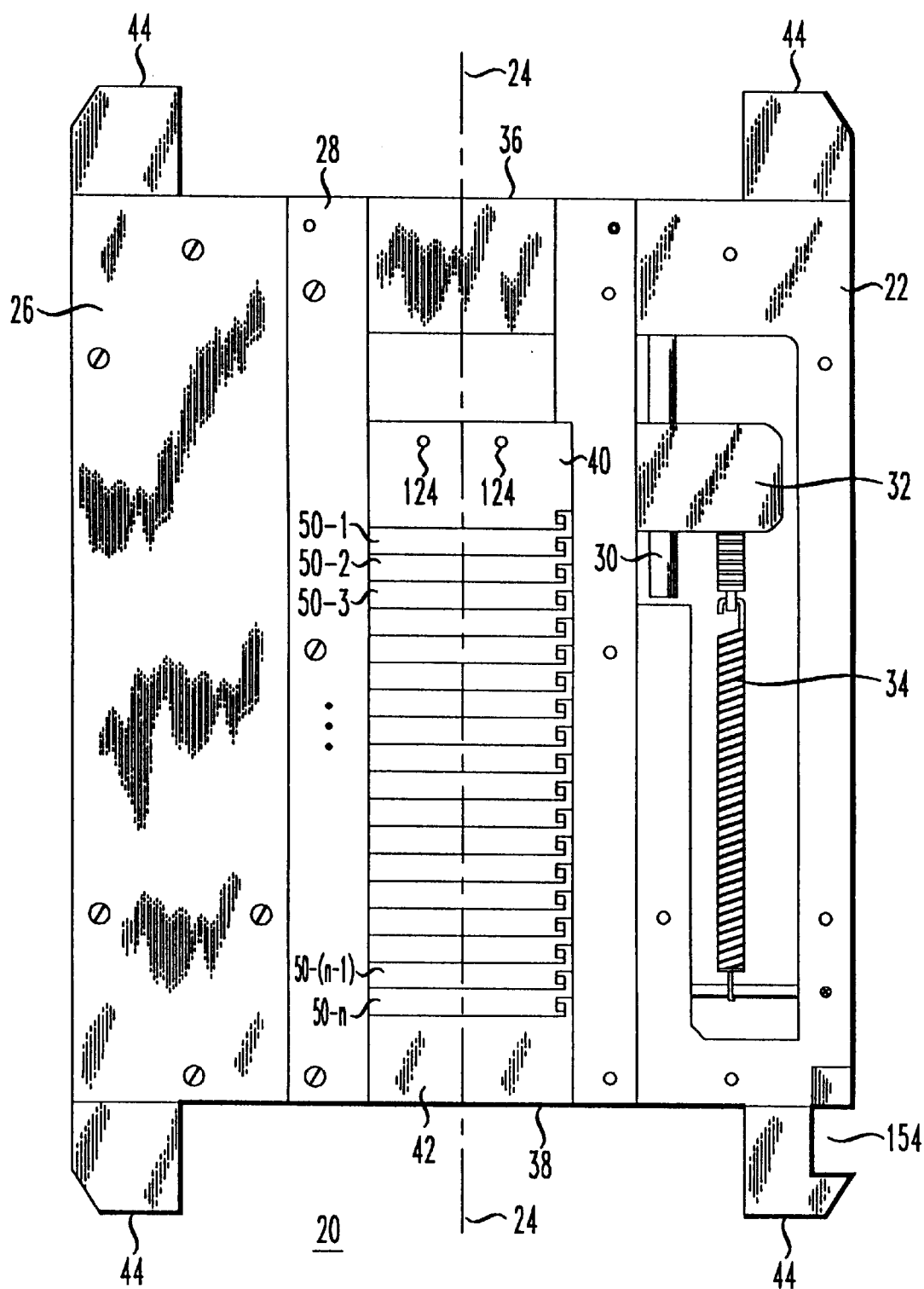
FIG. 4 is a top view of the fixture of FIG. 1 having the web in a closed position, with no bars therebetween.

As seen in FIGS. 1, 3 and 4, extensions 66 of web slat 50-1 cooperates with first plate 40. The edge of first plate 40 adjacent to web slat 50-1 replicates the structure of a web plate necessary for such interaction, including a laser bar engaging surface 56', protrusion 62', recess 64', inner edge 76', as well as surfaces 80' and 86'. Plate 40 is secured to cross member 32 and moves along guides 30 when cross member 32 is moved. Similarly, as best seen in FIGS. 1, 4 and 5, the edge of second plate 42 adjacent to web slat 50-n replicates the structure of a web slat necessary for such interaction, including a laser bar engaging surface 54', extension 66', distal end 68', recess 70', inner edge 72', and surfaces 82' and 84'. Second plate 42 is stationary relative to frame 22.

Spring 34 applies a force that biases cross member 32 towards second end 38 of frame 22, and hence toward second plate 42. With frame 22 stationary, when a force is applied to cross member 32 to overcome the bias of spring 34, cross member 32 moves along as constrained by guide rails 30 toward first end 36. As cross member 32 moves toward first end 36, each of the web slats 50 initially remains stationary as protrusion 62' on first plate 40 traverses recess 70 on the web slat 50-1 adjacent first plate 40. When the surface 80' of first plate 40 engages surface 82 of web slat 50-1, the web slat adjacent first plate 40, the spacing between second laser bar engaging surface 56' of first plate 40 and the first laser bar engaging surface 54 of web slat 50-1 are a maximum distance apart. The space between surfaces 56' and 54 defines a laser bar receiving space 88 and is typically slightly greater than the thickness of a laser bar 90 to be received therein. Continued movement of first plate 40 toward first end 36 causes web slat 50-1 to commence moving as protrusion 62 of web slat 50-1 traverses recess 70 of web slat 50-2 resulting in surface 80 of web slat 50-1 engaging surface 82 of web slat 50-2. Continued movement of first plate 40 and web slat 50-1 toward first end 36 causes web slat 50-2 to commence moving. Movement of web slat 50-2 opens another laser bar receiving space 88 between second laser bar engaging surface 56 of web slat 50-1 and first laser bar engaging surface 54 of web slat 50-2. Thus, it should be evident that the interlocking ends 56, 58 of web slats 50 cooperate with ends of adjacent web slats such that each web slat, in succession, engages the next web slat and opens the laser bar receiving space between the respective opposed laser bar engaging surfaces. The process of opening the web slats is referred to as expanding the web slats.

Near second plate 42, the last web slat, here referred to as web slat 50-n, when moved by engagement with web slat 50-(n-1) causes web slat 50-n to move until surface 80 of web slat 50-n engages surface 82' of second plate 42. At that position, the spacing between second laser bar engaging surface 56 of web slat 50-n and the first laser bar engaging surface 54' of second plate 42 is a maximum distance. Simultaneously, the spacing between the laser bar engaging surfaces of adjacent web slats, or between a web slat and first or second plates 40 and 42 are maximum, as illustrated in FIG. 1. This position of the web slats 50 is referred to as the fully opened position.

Starting from the fully opened position described above, with frame 22 stationary, as cross member 32 is moved relative to frame 22, such as toward second end 38 by the biasing force of spring 34, cross member 32 moves along and is constrained by guide rails 30. As cross member 32 moves toward second end 38 (and hence toward second plate 42), each of the web slats 50 initially remains stationary as protrusion 62' on first plate 40 traverses recess 70 on web slat 50-1 adjacent to first plate 40. Assuming there are no laser bars between the opposing laser engaging surfaces, second laser bar engaging surface 56' of first plate 40 will engage first laser bar engaging surface 54 of web slat 50-1, or surface 86' of first plate 40 will engage surface 84 of web slat 50-1. Continued movement of first plate 40 towards second end 38 will cause web slat 50-1 to also move. Web slat 50-1 engages web slat 50-2 in a similar manner and in succession reduces the spacing between the respective laser bar engaging surfaces in a process referred to as closing the web slats. The resulting positions of web slats 50, cross members 32 and spring 34 are shown in FIG. 4.

While the invention is described and shown as providing web slats 50 that reduce the laser bar receiving space 88 to substantially zero, it is understood that all that is necessary is that the web slats move apart sufficiently to receive a laser bar 90 in a respective laser bar receiving space 88 and move together sufficiently to secure a laser bar 90 in a laser bar receiving space 88.

When cross member 32 is moved towards second end 38 with laser bars inserted in the spacing between adjacent first and second laser bar engaging surfaces 54 and 56 or 56' and 54, or 56 and 54', a laser bar 90 is captured between the opposing first and second laser bar engaging surfaces 54 and 56, as best seen in FIG. 5.

Figure 6:
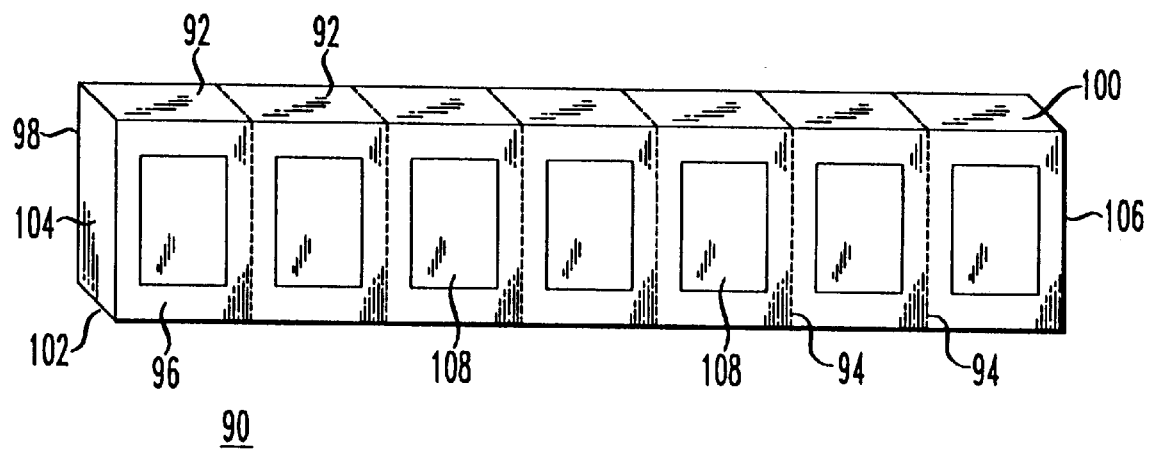
FIG. 6 is an enlarged perspective view of a laser bar.

Lasers are manufactured on a III-V or II-VI semiconductor wafer, such as indium phosphide or gallium arsenide, as is known in the art. The wafers are separated or cleaved into segments, known as laser bars, for facet coating. Each laser bar 90, as best seen in the enlarged perspective view of FIG. 6, is a parallelepiped, and contains a plurality of individual lasers 92, that are indicated by dotted lines 94. Each laser bar has a first pair of opposed major surfaces 96 and 98, a second pair of opposed major surfaces 100 and 102, and ends 104 and 106. During manufacture of laser bars 90, contacts 108 are formed on one or both of the first pair of major surfaces, such as surface 96. Contacts 108 are used to power the laser during testing, and subsequent to packaging, to power the laser during operation. The second pair of opposed major surfaces 100 and 102 are the major surfaces, or facets, to be coated.

Figure 7:
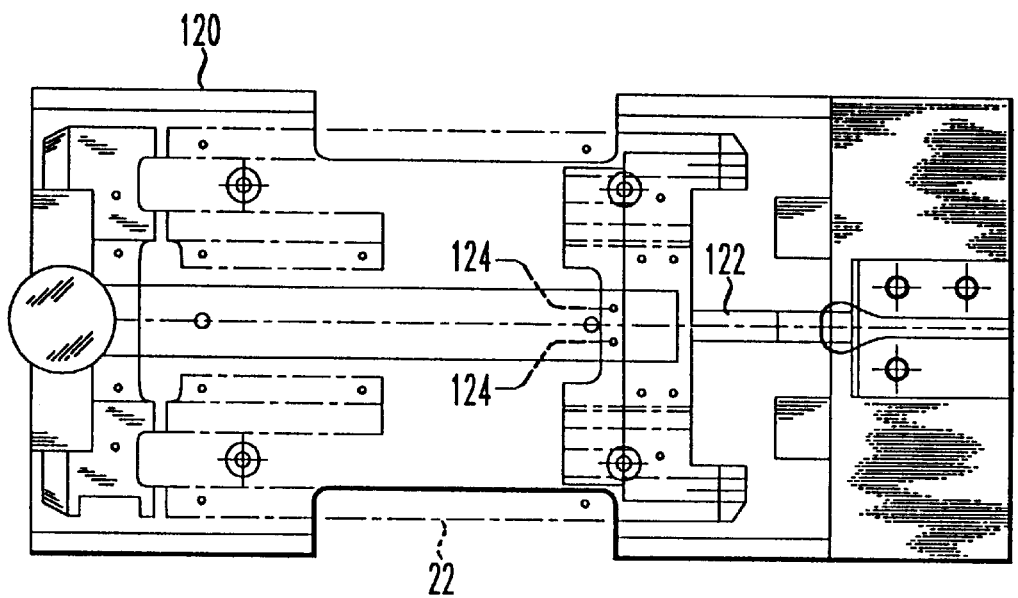
FIG. 7 is a top view of a loading block.

To open web slats 50 to receive laser bars 90 in laser bar receiving spaces 88, fixture 20 is positioned on a loading block 120, shown in the top view of FIG. 7. Fixture 20 is secured in loading block 120 such that the frame is stationary relative to the loading block. A slide 122 engages pins 124 extending from cross member 32. Slide 122 is movable against the bias of springs 34 to move web slats 50 to the fully opened position. A base 126 is substantially coplanar with the lower surface of web slats 50 and prevents laser bars 90, when received in laser bar receiving spaces 88, from falling out prior to being engaged by laser bar engaging surfaces 54, 54', 56 and 56'.

With web slats 50 in the fully opened position, laser bars 90 may be positioned in laser bar receiving spaces 88 between adjacent laser bar engaging surfaces. Laser bars 90 may be inserted either manually or with automated equipment such as by using a vacuum pick-up tool. Laser bars 90 are positioned with the first pair of opposed major surfaces 96 and 98 positioned adjacent to laser bar engaging surfaces 54, 54', 56 or 56'. When web slats 50 are closed, laser bar engaging surfaces 54, 54', 56 or 56' engage surfaces 96 and 98 of laser bars 90 and prevent surfaces 96 and 98 from being coated. Surfaces 100 and 102 are exposed for coating when the web slats are closed, one on each major surface of fixture 22.

The thickness of web slats 50 is substantially the thickness of the laser bars to be coated between surfaces 100 and 102. In this manner the surfaces 100 and 102 of laser bars 90, when secured in fixture 22, are substantially coplanar with the major surfaces of web slats 50. Web slats of different thicknesses may be used for laser bars of corresponding dimensions.

Similarly, the maximum distance between adjacent laser bar engaging surfaces 54 and 56 (or 54' and 56, or 56' and 54), can be varied depending on the distance between surfaces 96 and 98 of the laser bar being facet coated. For a laser bar having a distance between surfaces 100 and 102 designated "A" and a distance between surfaces 96 and 98 designated "B", the thickness of web slats 50 and the maximum distance between adjacent laser bar engaging surfaces 54 and 56 (or 54' and 56, or 56' and 54) shown in Table 1 have been found useful. Units are in inches.

TABLE 1

| dimension A | dimension B | slat thickness | maximum spacing |
| --- | --- | --- | --- |
| .030 | .0035 ± .0005 | .030 | .1000 |
| .015 | .0035 ± .0005 | .015 | .1100 |
| .012 | .0035 ± .0005 | .012 | .1120 |
| .010 | .0035 ± .0005 | .010 | .1130 |

Figure 8:
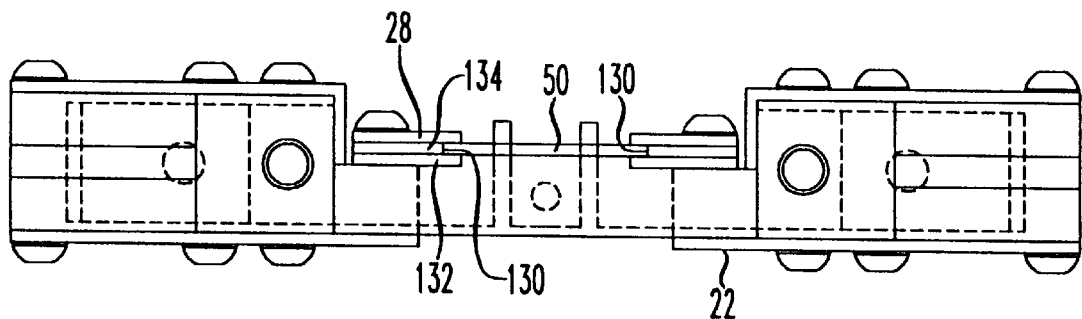
FIG. 8 is a cross-section of a fixture to show the slats slidingly secured in channels in the fixture.

As best seen in FIG. 8, first and second ends 58 and 60 of web slats 50 slide in a channel 130, such as is created by laminated layers 132, 134 and cover 36. Channel 130 is created by laminated layer 134 extending laterally a shorter distance than laminated layer 132 and cover 36. Laminated layer 134 is substantially the same thickness as a web slat 50, with a tolerance for allowing movement of slats 50 in channel 130.

With laser bars 90 positioned in some or all of laser bar receiving spaces 88, slide 122 is released and cross member 32 is pulled by the bias of springs 34 toward second end 38. Laser bar engaging surfaces 54, 54', 56 and 56' engage surfaces 96 and 98 of respective laser bars 90 (as shown in FIG. 5) to secure laser bars 90 in fixture 22. Fixture 22 is removed from loading block 120 and replaced with another fixture for loading.

Figure 9:
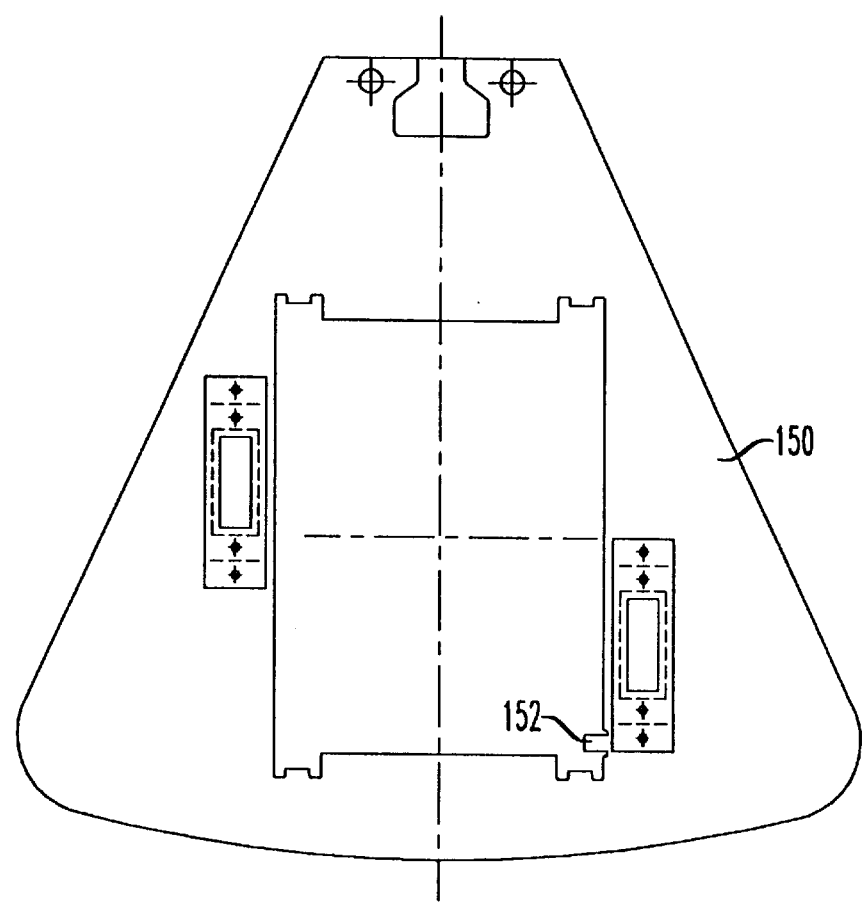
FIG. 9 is a plan view of a carrier frame to hold the fixture of FIGS. 1 and 2.

With laser bars 90 secured in fixture 22, the fixture is said to be loaded. A loaded fixture 22 is mounted in a carrier frame 150 shown in FIG. 9. Carrier frame 150 has a directional key 152 that cooperates with a key slot 154 in fixture 22, such as in a flange 44. The key and key slot assure that fixture 22 can be inserted in carrier frame 150 in only one orientation to, in turn, assure that surfaces 100 and 102 are coated.

Figure 10:
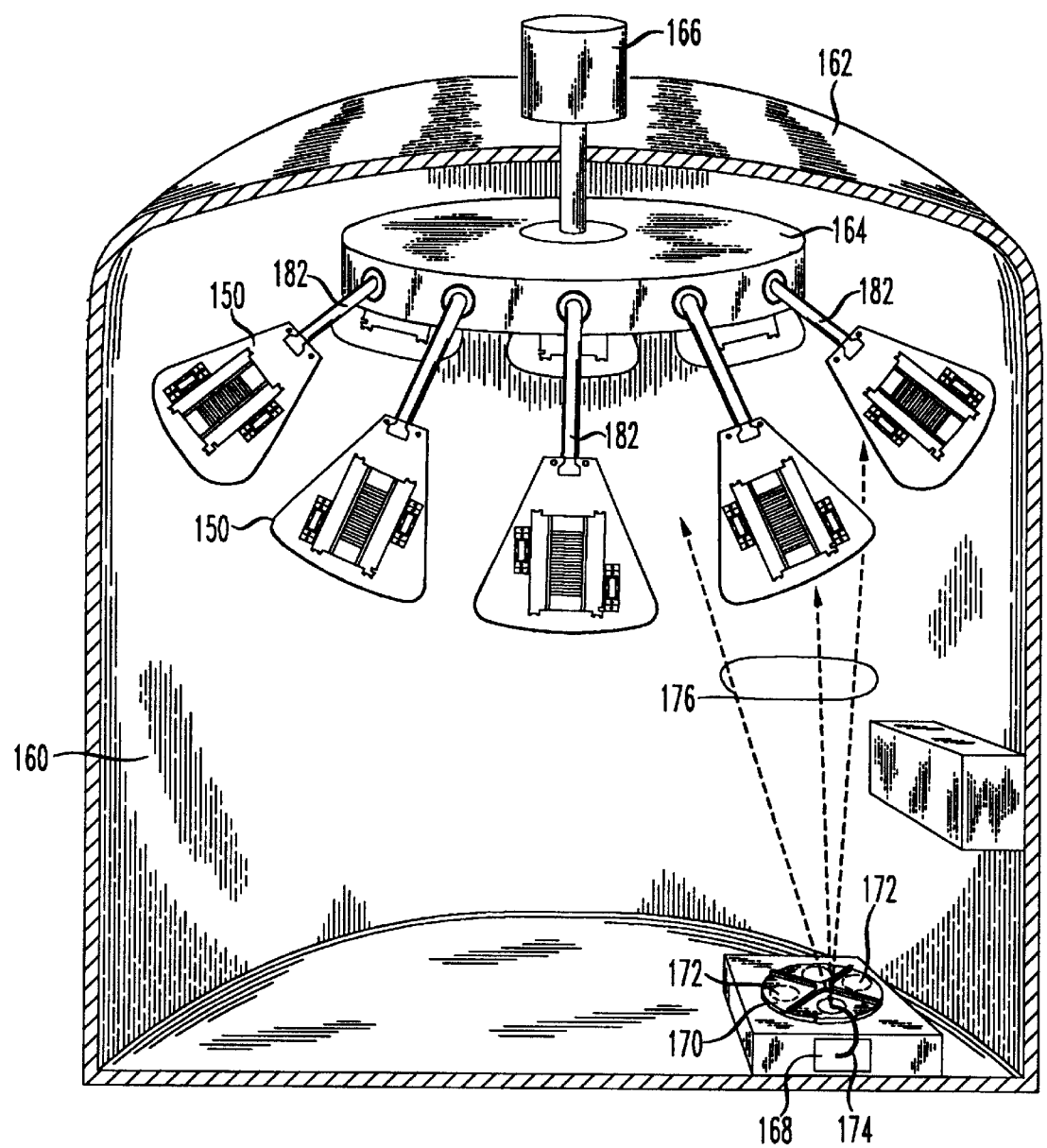
FIG. 10 is a side view, partially cut away, of a vacuum chamber in which the bar facet coating may be achieved.

A plurality of carrier frames 150 with loaded fixtures 22 secured therein are positioned in vacuum chamber 160 of an evaporator 162 such as shown in FIG. 10. Each carrier frame 150 is mounted on rotatable fixture 164, driven by drive 166. The invention is not limited to a particular mounting orientation. Fixture 164 operates to rotate about its drive axis, which may also be the axis of evaporator 162 if cylindrical.

Within vacuum chamber 160 is an electron beam source 168 and a remotely controlled, rotatable multi-compartment vessel 170 for holding various optical coating materials 172. With carrier frame 150 mounted in vacuum chamber 160, and coating material in at least one compartment of vessel 170, the vacuum chamber door (not shown) of evaporator 162 is closed and secured. The atmosphere of vacuum chamber 160 is evacuated, such as through a two-stage pumping mechanism (not shown) to lower the pressure in vacuum chamber 160 to a high vacuum condition. By way of example, the high vacuum condition may be 1E-06 to 1E-07 Torr range. Heat lamps (not shown) may be used to bake out vacuum chamber 160 and drive adsorbed water vapor from the walls of vacuum chamber 160. The electron beam source 168 is energized and the electron beam 174 is focused on the coating material 172 in one of the chambers of vessel 170. The coating material 172 is vaporized forming a vapor 176. Rotatable fixture 164 is rotated about its axis by drive 166. Each carrier frame 150 passes through vapor 176 with one of its major surfaces directed towards vessel 170, and thus vapor 176. In this manner, one of the surfaces 100 or 102 of laser bars 90 secured in fixture 22 is exposed to vapor 176 with the result that optical coating material 172 is electron beam evaporated, inter alia, onto surface 100 or 102 of each of the secured laser bars. Fixture 22 applies a uniform force along the length of laser bars 90 and holds laser bars 90 in a relatively small compact area. As a result, that the deposition of coating material is uniform on all of the laser bars processed in a batch. Furthermore, since fixture 22 holds laser bars 90 in a relatively small area, the throughput capacity of a single batch is greater than with prior art laser bar holding devices.

Various optical coating materials 172 are electron beam evaporated in vacuum chamber 160 onto laser bars secured in fixture 22. The type, amount, and rate of optical coating depends on the type of laser being manufactured. The materials may be quarter-wave layers of Yittra-Stabilized Cubic Zirconia (YSZ), silicon dioxide, titanium oxide, or silicon for the surface 100 or 102 that will be the mirror facet of a laser. Materials 172 may be deposited at various rates, such as at rates ranging from 2 Å per second to 10 Å per second. More than one material 172 may be evaporated and deposited by evaporating a first coating material for a first time period, and at the appropriate time in the deposition process, indexing vessel 170 to the next compartment such that a second coating material is evaporated for a second time period.

Without breaking the vacuum, carrier frames 150 on fixture 164 may be rotated 180° by rotating shafts 182 so that the other major surface of carrier frames 150, and hence the other surface 100 or 102 of laser bars 90, is exposed to vapor 176 and coated with an optical coating material 172. Shafts 182 are typically rotated with rotation of fixture 164 stopped and electron beam 174 turned off. With shafts 182 rotated, electron beam 174 can be turned on to again establish vapor 176. The optical material deposited on the second surface may be the same or a different coating (or coatings) as deposited on the first surface. The optical material deposited on the second surface may be an anti-reflection coating usually a quarter-wave length coating of YSZ, often deposited with an oxygen overpressure ranging from 5E-05 to 9E-05 Torr.

Subsequent to deposition of the optical coating materials, vacuum chamber 160 is vented to atmosphere and the carrier frames 150 removed. Fixtures 22 are removed from carrier frames 150 and again positioned in loading block 120. Web slats 50 are expanded to the fully opened positioned and coated laser bars are removed, such as by vacuum equipment, for further processing into individual laser chips, inspection and packaging.

Although the method and apparatus have been disclosed with respect to coating facets of a semiconductor laser chip, the invention is not limited thereto. The invention may be used for coating other devices. The invention may also be used in other deposition processes and is not limited to the deposition process described herein.

While the invention has been described as having structures at the ends of web slats 50 to move web slats 50 relative to each other, it is recognized that the structures need not be part of the web slats but could be present and move rectangular web slats, for example.

While the invention has been described having first plate 40 and second plate 42 that have features similar to a web slat 50 to cooperate with the web slats, it is recognized that a web slat could be secured to a modified plate so that the modified plate would not require features similar to a web slat 50.

Various semiconductor materials, optical coating materials, rates of application and pressures have been described as useful, however, the materials, rates of application and pressures are illustrative and the invention is not limited thereto.

The invention claimed is:

1. A holder for a plurality of devices, comprising:
   a plurality of members arranged adjacent to each other and translatable along an axis, ends of adjacent members cooperable with one another such that when one member is displaced along the axis, the other members are sequentially displaced in the same direction along the axis, adjacent members developing device-receiving spaces therebetween when moved apart and closing device-receiving spaces when moved closer together; and
   a bias member cooperable with at least one of the plurality of members to bias the members to close device-receiving spaces between adjacent members to capture devices received therein.

2. A holder for securing devices having surfaces for coating, comprising:
   first and second channels;
   a plurality of web slats, each of the web slats having first and second ends and first and second device engaging surfaces, the ends of the web slats received in respective channels, the ends of the web slats cooperating with ends of adjacent web slats in the same channel, the web slats secured at one end of the channels and otherwise movable along the channels between an open position and a less-opened position; and
   a bias member cooperating with one of the web slats to bias the web slats toward the end of the channels where the web slats are secured.

3. A holder for securing substantially parallelpiped devices having one or more surfaces for coating, comprising:
   first and second supports, each of the first and second supports having a channel therein, the channels forming first and second channels, the first and second channels opening toward each other and extending in a direction transverse thereto; and
   a plurality of web slats, each of the web slats having a first end received in and movable along the first channel, a second end received in and movable along the second channel, each of the web slats having device engaging surfaces, the first end of the web slats cooperating with the first end of adjacent web slats in the first channel, the second end of the web slats cooperating with the second end of adjacent web slats in the second channel, the web slats movable along the channel between an open position in which the device engaging surfaces of adjacent web slats are positioned apart to receive therebetween a device, and a captured position in which the device engaging surfaces of adjacent web slats are positioned closer together to engage surfaces of a device captured therebetween.

4. A holder as recited in claim 3, further comprising:
   the first ends of at least two of the plurality of web slats being interlocked.

5. A holder as recited in claim 3, wherein the interlocking first ends are on adjacent web slats.

6. A holder as recited in claim 3, further comprising the second ends of at least two of the plurality of web slats being interlocked.

7. A holder as recited in claim 6, wherein the interlocking second ends are on adjacent web slats.

8. A holder as recited in claim 4, further comprising:
   the second ends of at least two of the plurality of web slats being interlocked.

9. A holder as recited in claim 8, wherein the at least two web slats having interlocked first ends are the same at least two web slats having interlocked second ends.

10. A holder as recited in claim 3, further comprising:
    a key slot cooperable with a key to control orientation of the holder when mounted in a vacuum chamber.

11. A holder as recited in claim 3, further comprising:
    a first cross member extending between the first and second supports, the first cross member stationary relative to the supports, the first cross member cooperative with at least one of the plurality of web slats to prevent said at least one web slat from moving along the first and second channels, whereby one of the web slats is substantially stationary.

12. A holder as recited in claim 3, further comprising:
    a second cross member extending between the first and second supports, the second cross member movable parallel to the first and second channels, the second cross member cooperative with at least one of the plurality of web slats to move said at least one web slat along the first and second channels, whereby movement of the second cross member also moves the at least one web slat and in turn other of the web slats to open and close a device receiving space between adjacent web slats.

13. A holder as recited in claim 11, further comprising:
    a second cross member extending between the first and second supports, the second cross member movable parallel to the first and second channels, the second cross member cooperative with at least one of the plurality of web slats to move said at least one web slat along the first and second channels, whereby movement of the second cross member also moves the at least one web slat and in turn other of the web slats to open and close a device receiving space between adjacent web slats.

14. A holder as recited in claim 13, further comprising:
    a bias member coupled to the second cross member to bias the plurality of web slats in the first and second channels toward the first cross member.

15. A holder for a plurality of devices, a plurality of members arranged in tandem and translatable along an axis; ends of adjacent members coupled to one another so that when one member is displaced in a first direction along the axis, other members are sequentially displaced in the first direction, thereby forming gaps into which said devices are insertable.

16. A holder as recited in claim 15, further comprising:

a bias member, the bias member disposed to cause the plurality of members to be displaced in a second direction, opposite to the first direction, such that the members are urged against devices received therebetween.

17. A holder as recited in claim 16, wherein devices received between members are parallel pipeds with a pair of opposing surfaces, the members further comprising a pair of opposed engaging surfaces such that the engaging surfaces are urged against the opposing surfaces of the devices.

18. A holder as recited in claim 17, wherein the devices further comprise a second pair of opposed surfaces, the second pair of opposed surfaces being exposed when devices are received between opposed engaging surfaces.

* * * * *

UNITED STATES PATENT AND TRADEMARK OFFICE
CERTIFICATE OF CORRECTION

PATENT NO. : 5,911,830
DATED : June 15, 1999
INVENTOR(S) : Utpal Kumar Chakrabarti, Paul Sangone Chen, George John Przybylek, Dominic Paul Rinaudo It is certified that error appears in the above-identified patent and that said Letters Patent is hereby corrected as shown below:

On the Title page, item [54] should read --

Fixture For Laser Bar Facet Coating

--.

Signed and Sealed this

Twenty-ninth Day of August, 2000

Attest:

Q. TODD DICKINSON

*Attesting Officer*      *Director of Patents and Trademarks*